(12) United States Patent
Sun et al.

(10) Patent No.: US 8,487,642 B2
(45) Date of Patent: Jul. 16, 2013

(54) BURN-IN SOCKET AND TESTING FIXTURE USING THE SAME

(75) Inventors: Yu-Min Sun, Hsinchu (TW); Chih-Feng Cheng, Hsinchu (TW)

(73) Assignee: Global Unichip Corporation, Hsinchu (TW)

( * ) Notice: Subject to any disclaimer, the term of this patent is extended or adjusted under 35 U.S.C. 154(b) by 331 days.

(21) Appl. No.: 12/926,507

(22) Filed: Nov. 23, 2010

(65) Prior Publication Data

US 2012/0025860 A1 Feb. 2, 2012

(30) Foreign Application Priority Data

Jul. 28, 2010 (TW) .............................. 99124848 A

(51) Int. Cl.
*G01R 31/00* (2006.01)
(52) U.S. Cl.
USPC .................................................. 324/756.02

(58) Field of Classification Search
USPC ................ 324/762.01–762.1, 750.01–750.3, 324/756.01–756.07; 257/48; 438/14–18
See application file for complete search history.

(56) References Cited

U.S. PATENT DOCUMENTS

2008/0018353 A1* 1/2008 Thamarayoor ............... 324/765

* cited by examiner

*Primary Examiner* — Tung X Nguyen
(74) *Attorney, Agent, or Firm* — Bacon & Thomas, PLLC

(57) ABSTRACT

A burn-in socket for carrying an electronic device to let the electronic device electrically connect to a circuit board via the burn-in socket is provided. The electronic device has a body and at least a lead. The burn-in socket comprises a frame and a carrier, the frame has an opening and a plurality of first aligning potions, wherein the opening fits onto the contour of the body, and the first aligning portions surrounds the opening. The carrier has a plurality of second aligning portions. The frame is assembled to the carrier with the conjunction of the first aligning portions and the second aligning portions. The body is capable of fitting into the opening to let the lead electrically connect to the circuit board via the carrier.

8 Claims, 1 Drawing Sheet

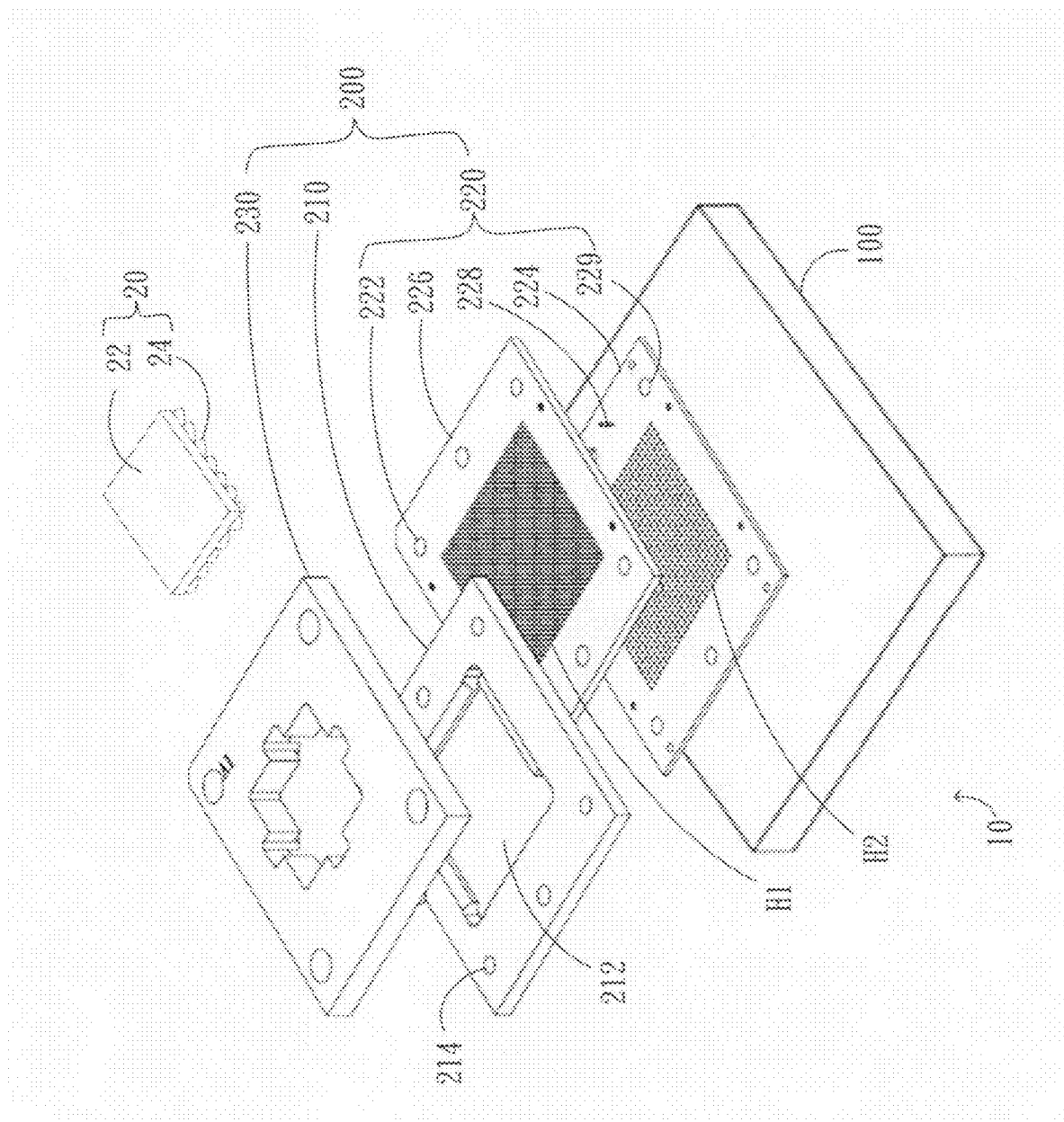

BURN-IN SOCKET AND TESTING FIXTURE USING THE SAME

BACKGROUND OF THE INVENTION

1. Field of the Invention

The present invention generally relates to a burn-in socket, and more particularly to a burn-in socket and a testing fixture using the same for testing an electronic device.

2. Description of the Prior Art

As development of the semiconductor technology, the sizes of the electronic devices become much more slim and light. The electronic devices are usually taken in a burn-in test in a high temperature, high voltage and high current environment after manufacturing, so as to find out the ones with lower lifetime. Thus, the reliability of the electronic devices may be enhanced.

In detail, during a burn-in test, an electronic device is assembled to a burn-in socket first, so as to be electronically connected to a test apparatus by the burn-in socket. After that, the electronic device is heated or applied with high voltage and high current by the test apparatus. Thus, the electronic device with lower lifetime may be found out and eliminated to ensure the quality of the electronic device. However, each batch of the electronic devices, such as memories, logic units and sockets, may have different contours and sizes, and amounts and locations of pins thereof depending on the electrical properties and circuit layouts may be different to one another. Therefore, numerous burn-in sockets with different specifications should be prepared for testing different electronic devices with different contours, sizes, and amounts and locations of pins thereof. Hence, the cost of manufacturing the conventional burn-in socket is quite high.

Further, the conventional burn-in socket is difficult to be disassembled for fixing as a result of forming integrally, and thus being abandoned when failure. In addition, the lead time of purchasing new burn-in socket from the suppliers will take about 6 weeks to 8 weeks. Hence, the cost of using the conventional burn-in socket is quite high.

Accordingly, it is necessary to develop new burn-in socket technologies for stably controlling burn-in test processes and monitoring electronic devices simultaneously, thereby burn-in test efficiency may be increased and research and development times and relative manufacturing costs may be reduced.

SUMMARY OF THE INVENTION

The present invention is directed to a burn-in socket and a testing fixture using the same, wherein a frame and a carrier of the burn-in socket are assembled to one another with the conjunction of aligning portions therebetween, so as to choose appropriate frames capable of fitting onto the contours of the bodies accompanying with a shareable carrier, or choose appropriate carriers according to the amounts or the locations of the leads accompanying with a shareable frame.

The present invention provides a burn-in socket for carrying an electronic device to let the electronic device electrically connect to a circuit board via the burn-in socket. The electronic device has a body and at least a lead. The burn-in socket includes a frame and a carrier. The frame has an opening and a plurality of first aligning portions, wherein the opening fits onto the contour of the body, and the first aligning portions surrounds the opening. The carrier has a plurality of second aligning portions. The frame is assembled to the carrier with the conjunction of the first aligning portions and the second aligning portions. The body is capable of fitting into the opening to let the lead electrically connect to the circuit board via the carrier.

The present invention further provides a testing fixture for an electronic device. The electronic device has a body and at least a lead. The testing fixture comprises a circuit board and the above-mentioned burn-in socket, and the body is capable of fitting into the opening of the frame of the burn-in socket to let the lead electrically connect to the circuit board via the carrier.

According to an embodiment of the present invention, the carrier comprises a bottom plate, a top plate and at least a contact element. The top plate is disposed on the bottom plate, the second aligning portions are disposed on the top plate, and the frame is assembled to the top plate with the conjunction of the first aligning portions and the second aligning portions. The contact element passes through and protruding out of the top plate and the bottom plate, wherein the lead is electrically connected to the circuit board via the contact element.

According to an embodiment of the present invention, the contact element may be a metal particle, a metal spring, a conductive elastomer, a pogo pin or the combinations thereof.

According to an embodiment of the present invention, the burn-in socket further comprises a cover assembled to the frame and leant against the body, so as to force the lead to electrically connect to the circuit board via the carrier.

Accordingly, the present invention may choose appropriate frames capable of fitting onto the contours of the bodies accompanying with a shareable carrier, or choose appropriate carriers according to the amounts or the locations of the leads accompanying with a shareable frame, so as to reduce the total amount of the components. In addition, it is possible to replace the broken part only when the burn-in socket of the present invention is failure. Thus, comparing to the conventional burn-in socket, the using cost of the present invention may be reduced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 illustrates an explosion diagram of a testing fixture according to an embodiment of the present invention.

DESCRIPTION OF THE PREFERRED EMBODIMENT

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

FIG. 1 illustrates an explosion diagram of a testing fixture according to an embodiment of the present invention. Referring to FIG. 1, a testing fixture 10 is capable of testing an electronic device 20, wherein the electronic device 20 has a body 22 and at least a lead 24. In the present embodiment, the lead 24 may be a solder ball and the amount thereof illustrated in FIG. 1 is plural.

The testing fixture 10 comprises a circuit board 100 and a burn-in socket 200, and the burn-in socket 200 is detachably assembled from a frame 210 and a carrier 220. The frame 210 has an opening 212 and a plurality of first aligning portions 214, wherein the opening 212 fits onto the contour of the body 22, and the first aligning portions 214 surrounds the opening 212. In addition, the carrier 220 has a plurality of second aligning portions 222, and the frame 210 may be assembled to the carrier 220 with the conjunction of the first aligning portions 214 and the second aligning portions 222.

In another word, the tester may first choose an appropriate frame 210 according to the contour of the body 22 and an appropriate carrier 220 according to the amount and the location of the leads 24, and assemble the frame 210 to the carrier 220 with the conjunction of the first aligning portions 214 and the second aligning portions 222 thereafter. Thus, the body 22 is just fitting into the opening 212, and the leads 24 are just electrically connect to the circuit board 100 via the carrier 220.

After that, the tester only needs to replace the frame with another appropriate one if the next electronic device and the tested one have different contours of the bodies but have the same amounts and locations of the leads. Alternatively, the tester only needs to replace the carrier with another appropriate one if the next electronic device and the tested one have the same contours of the bodies but have different amounts and locations of the leads. In another word, the present invention may use a shareable frame and/or a shareable carrier to test different electronic device. Thus, the amount of the testing fixtures with different specifications may be reduced and the flexibility in the use may be increased. In addition, comparing to the entire conventional burn-in socket is abandoned when failure, only the broken frame or the broken carrier should be replaced when the burn-in socket of the present invention is failure, thereby the using cost may be reduced.

In the present embodiment, the carrier 220 may comprise a bottom plate 224, a top plate 226 and at least a contact element 228. The top plate 226 is disposed on the bottom plate 224, and the second aligning portions 222 are disposed on the top plate 226, so as to assemble the frame 210 to the top plate 226 with the conjunction of the first aligning portions 214 and the second aligning portions 222. For example, one of the first aligning portions 214 and the second aligning portions 222 may be dents, and the other one may be protrusions with corresponding contours to the dents. Thus, the frame 210 may be assembled to the top plate 226 with the conjunction of the first aligning portions 214 and the second aligning portions 222 when disposed on the top plate 226. Alternatively, both of the first aligning portions 214 and the second aligning portions 222 may be apertures and passed through by a pin (non-illustrated herein) when aligned to one another, so as to assemble the frame 210 to the top plate 226 as well.

In addition, the top plate 226 has a first hole H1 and the bottom plate 224 has a second hole H2. The contact element 228 passes through the first hole H1 and the second hole H2, also, the contact element 228 protrudes out of the top plate 226 and the bottom plate 224, and the locations of the contact element 228 and the lead 24 and aligned to one another. Thus, the lead 24 may be electrically connected to the circuit board 100 via the contact element 228 when the body 22 is contained within the opening 212. In the present embodiment, the contact element 228 may be a metal particle, a metal spring, a conductive elastomer, or a pogo pin. Besides, the carrier 220 may further have a plurality of third aligning portions 229 disposed on the bottom plate 224 with corresponding locations to the second aligning portions 222. Hence, the top plate 226 may be assembled between the frame 210 and the bottom plate 224 when all of the first aligning portions 214, the second aligning portions 222 and the third aligning portions 229 are apertures aligned to one another and passed through by a pin (non-illustrated herein).

Furthermore, the burn-in socket 200 may further comprise a cover 230 assembled to the frame 210. The tester may push the cover 230 to lean against the body 22, so as to force the lead 24 to electrically connect to the circuit board 100 via the contact element 228 of the carrier 220. In some embodiment, upper portion of the body may protrude out of the frame, and bottom portion of the cover may have a dent fitting onto the contour of the upper portion of the body to completely contain the upper portion of the body. In addition, it is possible to replace the cover only with using the shareable frame and carrier for testing when the only difference between the different electronic devices is the contours of the upper portions of the bodies.

In summary, the cover, the frame and the carrier in the present invention are detachably assembled to one another. Thus, it is possible to share at least one of the cover, the frame and the carrier when using the testing fixture of the present invention to test the electronic devices with different specifications. Hence, the amount of the testing fixtures with different specifications may be reduced and the flexibility in the use may be increased. In addition, comparing to the entire conventional burn-in socket is abandoned when failure, it is possible to replace the broken cover, the broken frame and/or the broken carrier only when the burn-in socket of the present invention is failure, thereby the total cost may be reduced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A burn-in socket for carrying an electronic device to let said electronic device electrically connect to a circuit board having a body and at least a lead via said burn-in socket, said burn-in socket comprising:

a frame having an opening and a plurality of first aligning potions, wherein said opening fits onto said contour of said body, and said first aligning portions surround said opening; and a carrier having a plurality of second aligning portions, the carrier comprising:

a bottom plate having a second hole;

a top plate having a first hole disposed on said bottom plate, said second aligning portions being disposed on said top plate, and said frame being assembled to said top plate with the conjunction of said first aligning portions and said second aligning portions; and at least a contact element passing through the first hole and the second hole, the contact element protruding out of the top plate and the bottom plate, and said lead is electrically connected to said circuit board via said contact element; and wherein said frame is assembled to said carrier with the conjunction of said first aligning portions and said second aligning portions, and said body is capable of fitting into said opening to let said lead electrically connect to said circuit board via said carrier.

2. The burn-in socket according to claim 1, wherein said carrier further comprises a plurality of third aligning portions disposed on said bottom plate with corresponding locations to said second aligning portions.

3. The burn-in socket according to claim 1, wherein said contact element comprises a metal particle, a metal spring, a conductive elastomer, a pogo pin and the combinations thereof.

4. The burn-in socket according to claim 1 further comprising a cover assembled to said frame and leant against said body to force said lead to electrically connect to said circuit board via said carrier.

5. A testing fixture for an electronic device having a body and at least a lead, said testing fixture comprising:
 a circuit board; and
 a burn-in socket comprising:
  a frame having an opening and a plurality of first aligning potions, wherein said opening fits onto said contour of said body, and said first aligning portions surround said opening; and
  a carrier having a plurality of second aligning portions, the carrier comprising:
   a bottom plate having a second hole; and
   a top plate having a first hole disposed on said bottom plate, said second aligning portions being disposed on said top plate, said frame being assembled to said top plate with the conjunction of said first aligning portions and said second aligning portions; and
  at least a contact element passing through the first hole and the second hole so that the contact element protruding out of the top plate and the bottom plate, said lead is electrically connected to said circuit board via said contact element; and
 wherein said frame is assembled to said carrier with the conjunction of said first aligning portions and said second aligning portions, and said body is capable of fitting into said opening to let said lead electrically connect to said circuit board via said carrier.

6. The testing fixture according to claim 5, wherein said carrier further has a plurality of third aligning portions disposed on said bottom plate with corresponding locations to said second aligning portions.

7. The testing fixture according to claim 5, wherein said contact element comprises a metal particle, a metal spring, a conductive elastomer, a pogo pin and the combinations thereof.

8. The testing fixture according to claim 5, wherein said burn-in socket further comprises a cover assembled to said frame and leant against said body to force said lead to electrically connect to said circuit board via said carrier.

* * * * *